(12) United States Patent
Kitagawa

(10) Patent No.: US 6,172,568 B1
(45) Date of Patent: Jan. 9, 2001

(54) POWER AMPLIFIER

(75) Inventor: Shigeru Kitagawa, Hirakata (JP)

(73) Assignee: Matsushita Electric Industrial Co., Ltd., Osaka (JP)

(*) Notice: Under 35 U.S.C. 154(b), the term of this patent shall be extended for 0 days.

(21) Appl. No.: 09/208,419

(22) Filed: Dec. 10, 1998

(30) Foreign Application Priority Data

Dec. 16, 1997 (JP) .................................................. 9-346036

(51) Int. Cl.$^7$ ...................................................... H03F 3/04
(52) U.S. Cl. ............................................. 330/297; 330/127
(58) Field of Search ................................... 330/127, 133, 330/134, 285, 297

(56) References Cited

U.S. PATENT DOCUMENTS

| 4,333,059 | | 6/1982 | Yamaguchi et al. . | |
| 4,435,846 | * | 3/1984 | Weise ..................................... | 330/297 |
| 5,182,527 | * | 1/1993 | Nakanishi et al. .................... | 330/285 |
| 5,604,924 | * | 2/1997 | Yokoya ................................. | 330/297 |
| 5,892,404 | * | 4/1999 | Tang ..................................... | 330/297 |

FOREIGN PATENT DOCUMENTS 61-23687   6/1986   (JP) .

* cited by examiner

*Primary Examiner*—Robert Pascal
*Assistant Examiner*—Khanh Van Nguyen
(74) *Attorney, Agent, or Firm*—Wenderoth, Lind & Ponack, L.L.P.

(57) ABSTRACT

In a power amplifier, a voltage amplifier stage amplifies voltage of an input signal on the basis of a feedback voltage from a feedback circuit and provides an output signal. A power amplifier stage amplifies power of the output signal from the voltage amplifier stage and provides an output signal. The output signal from the power amplifier stage is supplied to a load and also to the feedback circuit and a voltage divider. The voltage divider divides the output signal from the power amplifier stage to output a divided voltage. A constant voltage circuit regulates a supplied DC voltage to a constant voltage with a voltage at an internal reference point being swung due to the divided voltage from the voltage divider, and then supplies a regulated DC voltage to the voltage amplifier stage. Since the voltage amplifier stage operates with the regulated DC voltage, it can strengthen a voltage of its own output signal and the withstand voltage of the voltage amplifier stage can be lower than a withstand voltage of the power amplifier stage. This results in a high power amplifier with a low price.

6 Claims, 6 Drawing Sheets

PRIOR ART

POWER AMPLIFIER

BACKGROUND OF THE INVENTION

1. Field of the Invention

The present invention relates to power amplifiers, and more particularly to a power amplifier that amplifies power of an input signal by using an output signal fed back.

2. Description of the Background Art

A conventional power amplifier disclosed in Japanese Patent Publication No. 61-23687 will now be described while referring to the block diagram of FIG. 7. In FIG. 7, the power amplifier includes an input terminal 1, a voltage amplifier stage 2, a power amplifier stage 3, including transistors Q1 to Q4, a feedback circuit 4, a DC power source 5, and an output terminal 6. Such a power amplifier operates as follows. An input signal of this power amplifier is provided to the voltage amplifier stage 2 through the input terminal 1. The voltage amplifier stage 2 amplifies the voltage of the input signal up to a given value on the basis of the feedback voltage described later and provides the output to the power amplifier stage 3. Since the power amplifier stage 3 is generally formed of a complementary circuit (SEPP circuit), its voltage amplification is one. Accordingly, when receiving the output signal from the voltage amplifier stage 2, the power amplifier stage 3 amplifies the current of the input signal up to a given value, without amplifying the voltage value of the input signal. The signal amplified by the power amplifier stage 3 is supplied to a load (not shown) through the output terminal 6, and is also supplied to the feedback circuit 4. The feedback circuit 4, having two internal resistors, attenuates the voltage of the supplied signal and feeds the feedback voltage back to the voltage amplifier stage 2.

As described above, with the combination of the voltage amplifier stage 2 and the power amplifier stage 3, the power amplifier amplifies power of the input signal and supplies it to the load.

The DC power source 5 supplies DC power-supply voltages +Vcc2 and −Vcc2 to the voltage amplifier stage 2 and the power amplifier stage 3. It is required to greatly vary the load voltage for supplying large power to the load since the power amplifier stage 3 has a voltage amplification equal to one. According to the power amplifier of FIG. 7, while the voltage supplied to the load must be varied up to the DC power-supply voltages ±Vcc2, the output voltage of the voltage amplifier stage 2 must also be varied up to the DC power-supply voltages ±Vcc2, since the voltage amplification of the power amplifier stage 3 is one. This requires the voltage amplifier stage 2 to be able to withstand the same voltage as the power amplifier stage 3. That is to say, in order for the power, amplifier to provide high power requires the use of transistors capable of withstanding high voltages in the voltage amplifier stage 2. However, transistors with high withstand voltages are expensive, which will result in an increased price of the power amplifier.

SUMMARY OF THE INVENTION

An object of the present invention is to provide a high power amplifier at a low price. The invention achieves this object with the following characteristic structure.

According to a first aspect, a power amplifier for amplifying power of an input signal by using an output signal fed back comprises: a voltage amplifier stage for amplifying voltage of the input signal to provide an output signal; a power amplifier stage for amplifying power of the output signal from the voltage amplifier stage to provide an output signal; a voltage divider for dividing the output signal from the power amplifier stage to output a divided voltage; and a constant voltage circuit for regulating a supplied DC voltage to a constant voltage, with a voltage at an internal reference point being varied by the divided voltage outputted from the voltage divider, and then supplying the regulated DC voltage to the voltage amplifier stage.

According to the first aspect above, the voltage divider divides the output signal from the power amplifier stage and applies a divided voltage to the reference point in the constant voltage circuit. The constant voltage circuit regulates the supplied DC voltage to a constant voltage with the voltage at the reference point being varied by the applied divided voltage and then supplies the regulated DC voltage to the voltage amplifier stage. Since the voltage amplifier stage operates with the regulated DC voltage, it can strengthen the voltage of its own output signal and the withstand voltage of the voltage amplifier stage can be lower than the withstand voltage of the power amplifier stage. This results in a high power amplifier that has a low price.

A second aspect depends on the first aspect, in which the power amplifier further comprises a DC power source for supplying the DC voltage to the constant voltage circuit, wherein the DC power source also supplies the DC voltage to the power amplifier stage.

According to the second aspect above, the DC power source supplies DC voltage to both the power amplifier stage and the constant voltage circuit. According to the second aspect, the power-supply structure of the power amplifier can be simplified. This results in a power amplifier that has a still lower price.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
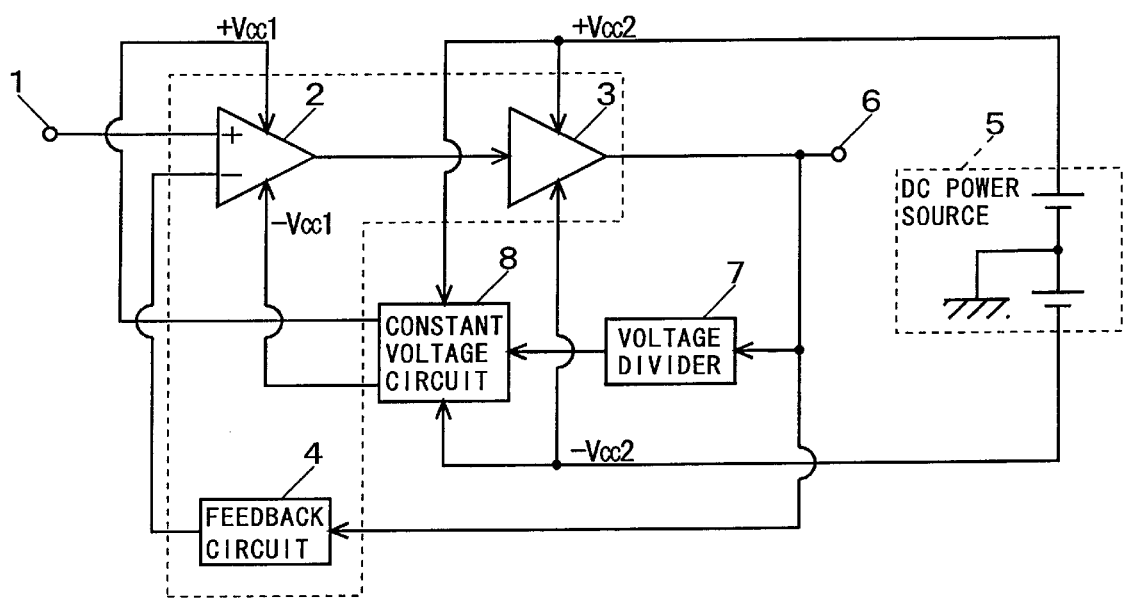
FIG. 1 is a block diagram showing the entire structure of a power amplifier according to a preferred embodiment of the present invention.

A power amplifier according to a preferred embodiment of the present invention will now be described referring to FIGS. 1 to 6. In the block diagram shown in FIG. 1, the power amplifier includes an input terminal 1, a voltage amplifier stage 2, a power amplifier stage 3, a feedback circuit 4, a DC power source 5, an output terminal 6, a voltage divider 7, and a constant voltage circuit 8.

The input signal to this power amplifier is applied to the voltage amplifier stage 2 through the input terminal 1. The voltage amplifier stage 2 operates with DC power-supply voltages +Vcc1 and −Vcc1 supplied from the constant voltage circuit 8 (described later), and the voltage amplifier stage 2 has a withstand voltage is equal to 2×Vcc1. This voltage amplifier the stage 2 amplifies voltage of the input signal up to a given value on the basis of the feedback voltage from the feedback circuit 4 (described later) and provides the output to the power amplifier stage 3.

The power amplifier stage 3 operates with DC power-supply voltages +Vcc2 and −Vcc2 supplied from the DC power source 5, and the power amplifier stage 3 has a withstand voltage of 2×Vcc2. Where Vcc2>Vcc1. The power amplifier stage 3 receives the voltage-amplified signal from the voltage amplifier stage 2 and amplifies the current of the input signal up to a given value, without amplifying the input signal voltage (i.e. it outputs voltage in the same phase), to provide its output.

The output from the power amplifier stage 3 is supplied to a load (not shown) through the output terminal 6 and is also supplied to the feedback circuit 4 and the voltage divider 7. The feedback circuit 4 attenuates the output voltage of the power amplifier stage 3 and outputs it as the feedback voltage to the voltage amplifier stage 2.

Figure 2:
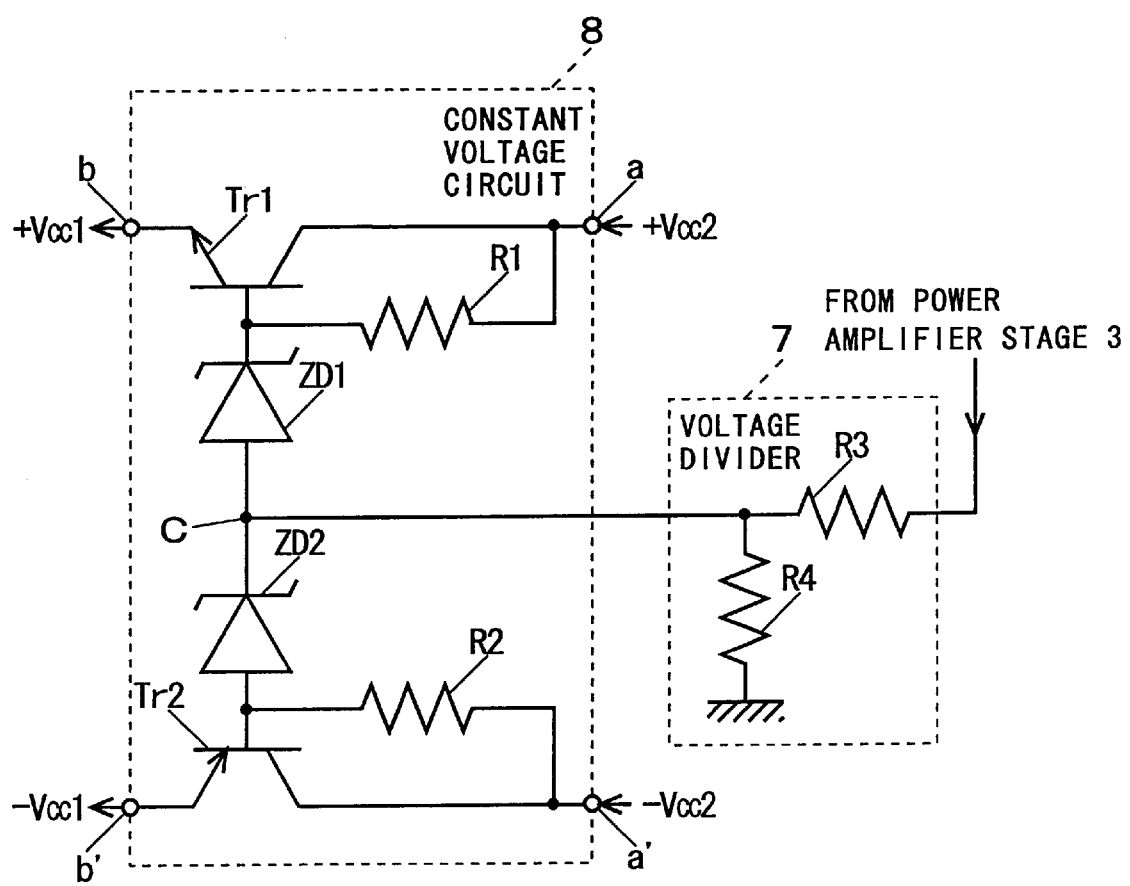
FIG. 2 is a circuit diagram showing a detailed structure of a voltage divider 7 and a constant voltage circuit 8 shown in FIG. 1.

As shown in FIG. 2, the voltage divider 7, which is one of the unique elements of the invention, includes Resistances R3 and R4. This voltage divider 7 divides the output voltage of the power amplifier stage 3 to output a divided voltage Vd in phase with the output waveform of the voltage amplifier stage 2 to the constant voltage circuit 8.

As shown in FIG. 2, the constant voltage circuit 8, which is one of the structural elements unique to the invention, includes Resistances R1 and R2, Zener diodes ZD1 and ZD2, and an NPN transistor Tr1 and a PNP transistor Tr2. An anode of the Zener diode ZD1 and a cathode of the Zener diode ZD2 are connected to each other. The Zener diodes ZD1 and ZD2 are connected to each other in series toward the same direction. The transistor Tr1 has its collector connected to the input end "a", its emitter connected to the output end "b", and its base connected to a cathode of the Zener diode ZD1. The Resistance R1 is connected between the base and collector of the transistor Tr1. The transistor Tr2 has its collector connected to the input end "a", its emitter connected to the output end "b", and its base connected to an anode of the Zener diode ZD2. The Resistance R2 is connected between the base and collector of the transistor Tr2. In the constant voltage circuit 8 thus constructed, the voltage reference point C is set between the Zener diodes ZD1 and ZD2.

When the divided voltage Vd is applied from the voltage divider 7 to the reference point C, the DC voltage +Vcc1 determined by the value of the Resistance R1 and characteristics of the Zener diode ZD1 is generated between the emitter of the transistor Tr1 (the output end "b") and the reference point C. Between the emitter of the transistor Tr2 (the output end "b'") and the reference point C, the DC voltage −Vcc1 determined by the value of the Resistance R2 and characteristics of the Zener diode ZD2 is generated. The reference point C has the voltage indicating the middle value between the DC power-supply voltages +Vcc1 and −Vcc1.

Figure 3:
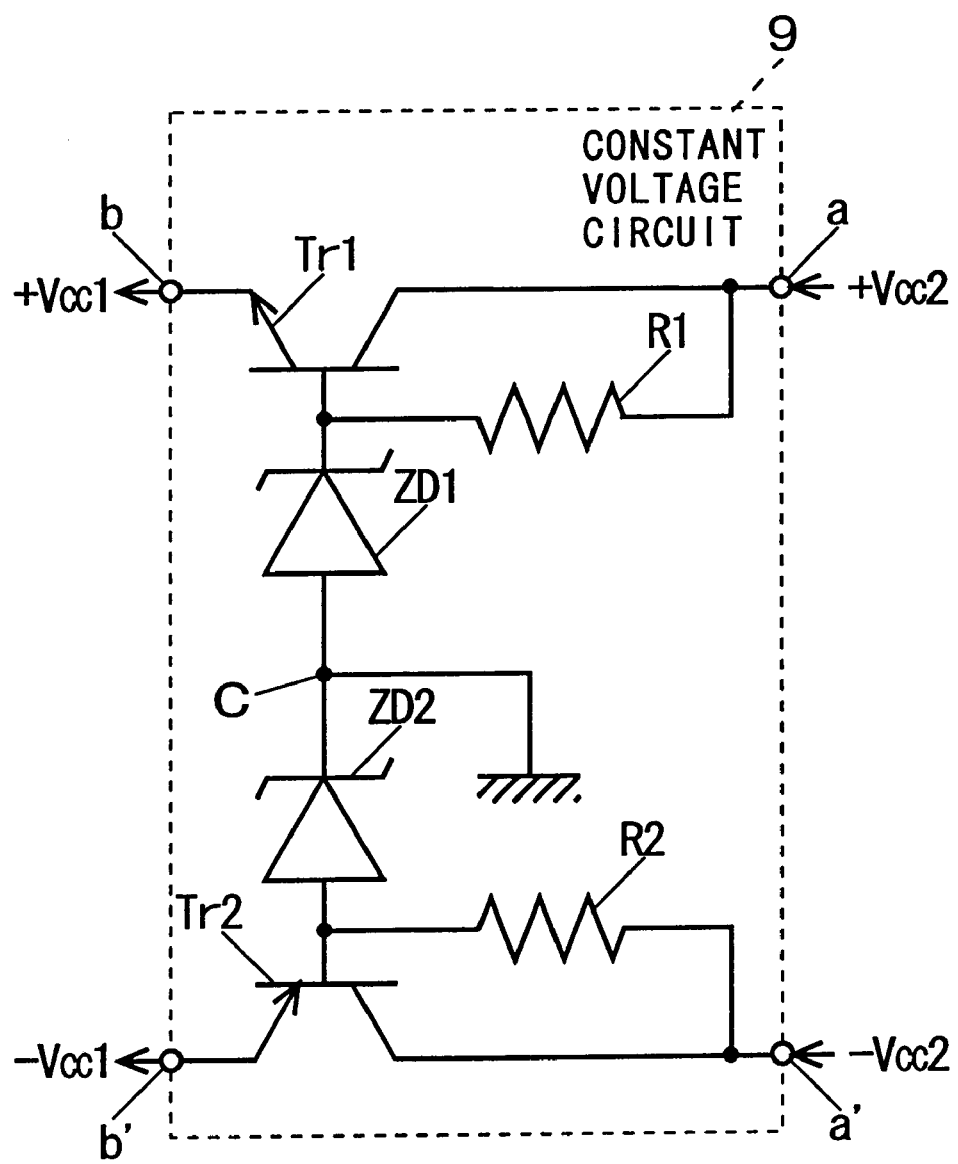
FIG. 3 is a circuit diagram showing a constant voltage circuit 9 used for the purpose of clearly showing the technical effect of the present invention, in which the voltage divider 7 is omitted and a reference point C is grounded.
Figure 4:
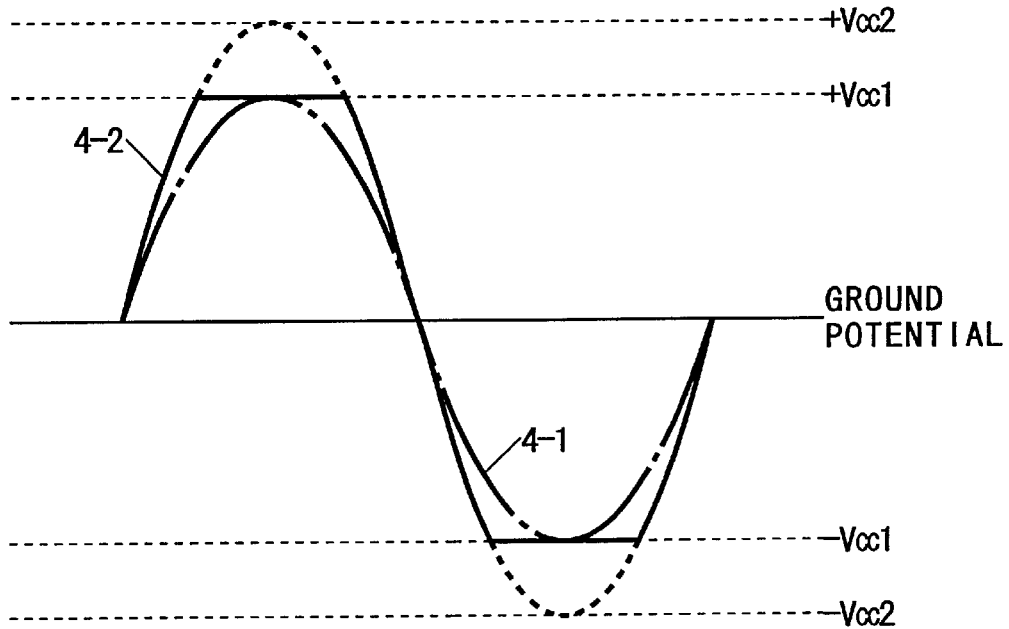
FIG. 4 shows output voltage waveforms of a voltage amplifier stage 2 in a power amplifier having the constant voltage circuit 9 shown in FIG. 3.

To clearly show the technical effects of the invention, now we schematically consider, referring to FIG. 4, voltage waveforms at individual parts of a power amplifier having a constant voltage circuit 9 shown in FIG. 3 in which the reference point C is grounded, in place of the voltage divider 7 and the constant voltage circuit 8 shown in FIG. 2. FIG. 4 shows the output voltage waveforms of the voltage amplifier stage 2 in this case.

For the constant voltage circuit 9 shown in FIG. 3, due to the voltage drop because of the constant-voltage regulation, the input voltages ±Vcc2 and the output voltages ±Vcc1 have the relation 2×Vcc2>2×Vcc1. In other words, when the power amplifier has the constant voltage circuit 9, even if the withstand voltage of the power amplifier stage 3 is 2×Vcc2, the withstand voltage of the voltage amplifier stage 2 can be lower than that of the power amplifier stage 3, that is, it can be 2×Vcc1. In the output voltage of this voltage amplifier stage 2 with low withstand voltage, as shown by the curve 4-1 in FIG. 4 (see the one-dot chain line), the part where the output voltage value <|Vcc1| is not clipped, but as shown by the curve 4-2 in the diagram (see the solid line), the part where the output voltage value >|Vcc1| is clipped. When the output voltage of the voltage amplifier stage 2 is thus clipped, the power amplifier stage 3 (voltage amplification=1) outputs the clipped voltage.

As can be seen from the description above, the maximum voltage that the power amplifier stage 3 can output depends on the maximum output voltage of the voltage amplifier stage 2, and the maximum voltage that the voltage amplifier stage 2 can output is the voltage supplied to it, i.e. the DC power-supply voltage 2×Vcc1 supplied from the constant voltage circuit 9. In other words, the maximum output of the power amplifier stage 3 is limited by the DC power-supply voltage supplied from the constant voltage circuit 9. That is to say, in the constant voltage circuit 9 which is not supplied with a divided voltage from the voltage divider 7, the DC power-supply voltage 2×Vcc2 supplied from the DC power source 5 is regulated to the constant voltage 2×Vcc1, which is supplied as the DC power-supply voltage 2×Vcc1 to the voltage amplifier stage 2. However, because of the restriction of 2×Vcc2>2×Vcc1 for the constant-voltage regulation, the voltage amplifier stage 2 cannot supply sufficient driving voltage to the power amplifier stage 3.

Figure 5:
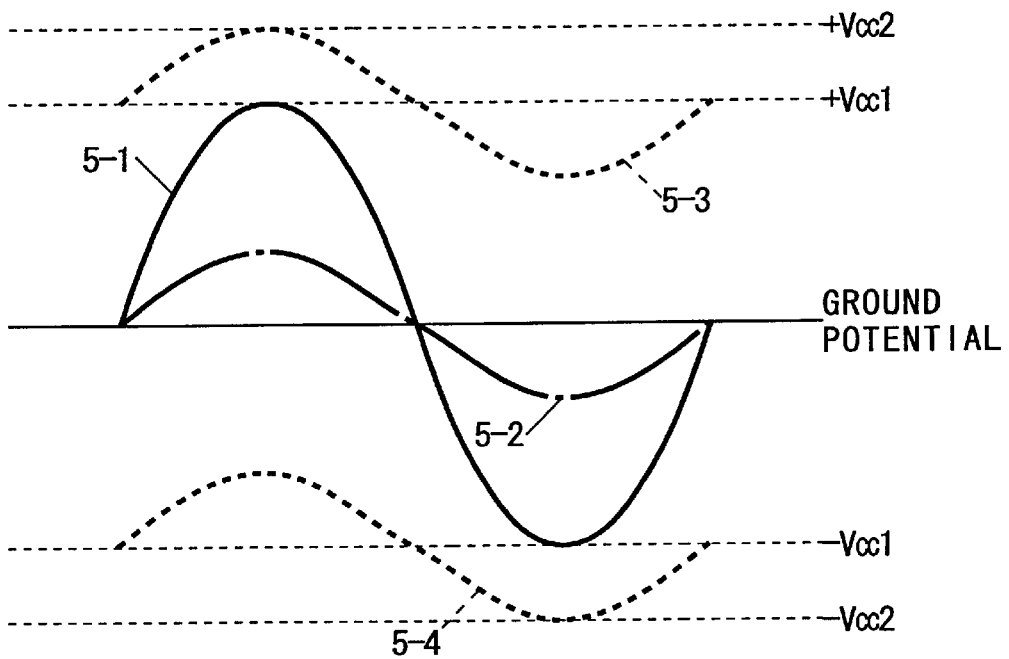
FIG. 5 shows output voltage waveforms at major parts in the power amplifier having the voltage divider 7 and the constant voltage circuit 8 shown in FIG. 2.

Next, referring to FIG. 5, we schematically consider the input/output voltage waveforms of the voltage divider 7 shown in FIG. 2 and output voltage waveforms of the constant voltage circuit 8. The individual voltage waveforms in FIG. 5 are shown with respect to ground. First, when the signal shown by the curve 4-1 in FIG. 4 (see the one-dot chain line) is applied to the power amplifier stage 3 whose input/output are in the same phase and whose voltage amplification is one, the power amplifier stage 3 outputs the signal shown by the curve 5-1 in FIG. 5 (see the solid line) to the voltage divider 7 shown in FIG. 2 and the like. The voltage divider 7 divides the input signal (see the curve 5-1) on a division ratio determined by the internal Resistances R3 and R4 to output the divided voltage Vd. The values of the Resistance R3 and R4 which determine the division ratio are determined to satisfy the relation of "divided voltage Vd=Vcc2−Vcc1." Thus, the voltage divider 7 divides the input signal shown by the curve 5-1 to output the divided voltage Vd having the waveform shown by the curve 5-2 in the diagram. This divided voltage Vd is applied to the reference point C in the constant voltage circuit 8.

As stated above, the constant voltage circuit 8 regulates the input voltage +Vcc2 at the input end "a" to produce +Vcc1 at the output end "b". Then, combined with the divided voltage Vd applied to the reference point C, the voltage at +Vcc1 produces the waveform shown by the curve 5-3 in FIG. 5 (see the upper dotted line) with respect to ground. Similarly, with respect to ground, the voltage waveform of −Vcc1 produced at the output end "b'" on the basis of the input voltage −Vcc2 at the input end "a'" is that shown by the curve 5-4 in FIG. 5 (see the lower dotted line). In this way, the constant voltage circuit 8 regulates the DC power-supply voltages ±Vcc2 to the DC power-supply voltages ±Vcc1, with the voltage at the reference point C being varied by the divided voltage Vd in phase with the voltage amplifier stage 2, and supplies them to the voltage amplifier stage 2. While the DC power-supply voltage supplied is constant at 2×Vcc1, the reference point is shifted in the same direction with the output voltage of the voltage amplifier stage 2. Thus, the voltage amplifier stage 2 can amplify the voltage of the input signal to such a voltage value as would be clipped when the reference point C is grounded, and provide the output. More specifically, with the shift of the reference point, the voltage amplifier stage 2 can amplify the input signal to peak voltage values of ±Vcc2. Since the DC power-supply voltages ±Vcc2 have the same value as the withstand voltage 2×Vcc1 of the voltage amplifier stage 2, no problem is caused about the voltage amplifier stage 2 (more specifically, about the withstand voltage of the transistors forming the voltage amplifier stage 2).

Considered next is a case where the division ratio of the voltage divider 7 is varied. When the division ratio of the voltage divider 7 is varied and a divided voltage larger than the divided voltage Vd=Vcc2−Vcc1 is supplied to the reference point C, the voltage amplifier stage 2 provides an output at a voltage sufficient to drive the power amplifier stage 3 in spite of the fact that it amplifies the input voltage whose peak value is lower than Vcc1. On the other hand, when a divided voltage smaller than the divided voltage Vd=Vcc2−Vcc1 is applied to the reference point C, the voltage amplifier 2 cannot sufficiently drive the power amplifier stage 3.

Figure 6:
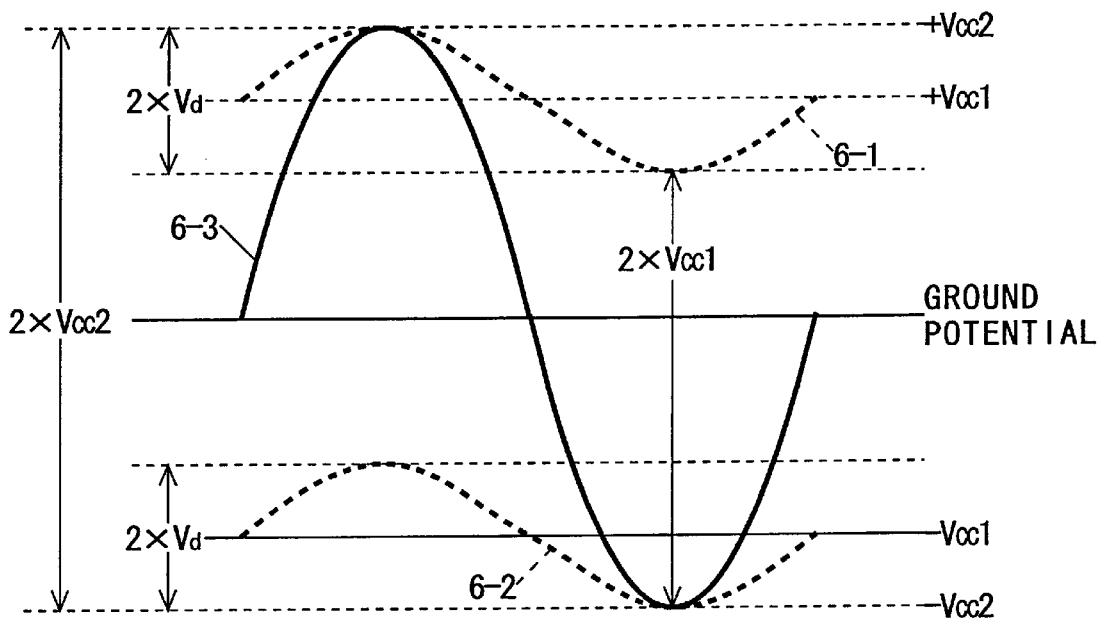
FIG. 6 shows waveforms of DC power-supply voltages applied to the voltage amplifier stage 2 and the output voltage waveform of the voltage amplifier stage 2 (which also corresponds to the input voltage waveform to the power amplifier stage 3)
Figure 7:
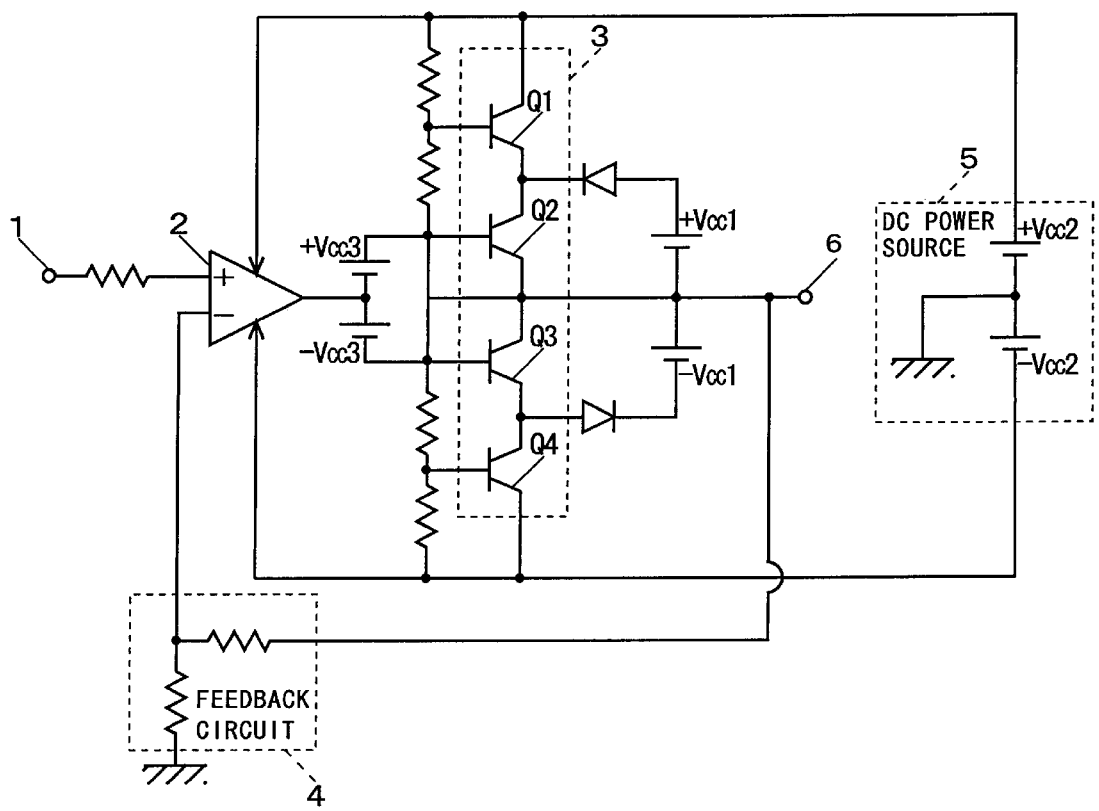
FIG. 7 is a block diagram showing the entire structure of a conventional power amplifier.

FIG. 6 shows waveforms of the DC power-supply voltages applied to the voltage amplifier stage 2 and the output voltage waveform of the voltage amplifier stage 2 (which is also the input voltage waveform of the power amplifier stage 3) with respect to the ground potential. In FIG. 6, the curves 6-1 and 6-2 show the DC power-supply voltage 2×Vcc1 with respect to the potential at the ground potential. Now, assuming that 2×Vcc1=100 [V] and that the DC power-supply voltage of the power amplifier stage 3 is 2×Vcc2=120 [V], then as is clear from the description above, the output voltage of the voltage amplifier stage 2 has its peak values at 2×Vcc2=120 [V].

Next, the effects of this embodiment will be described. The voltage amplifier stage 2 is supplied with the DC power-supply voltages ±Vcc1. While the DC power-supply voltages ±Vcc1 are lower than the DC power-supply voltages ±Vcc2 due to the voltage drop in the constant voltage circuit 8, the voltage at the reference point C in the constant voltage circuit 8 is varied due to the divided voltage Vd in phase with the output voltage of the voltage amplifier stage 2 in the same direction with respect to the output voltage of the voltage amplifier stage 2. The voltage amplifier stage 2 operates with the DC power-supply voltages ±Vcc1 to amplify the voltage of the input signal and outputs it. Accordingly, the output from the voltage amplifier stage 2 can make up for the lack of voltage for driving the power amplifier stage 3. As a result, the voltage amplifier stage 2 can amplify the input signal to such an output voltage as would be clipped when the reference point C is at the same potential as ground.

In other words, the above effect means that a high power amplifier is realized in spite of the fact that the withstand voltage of the voltage amplifier stage 2 can be lower than that of the power amplifier stage 3. As described above, this embodiment realizes a power amplifier at a lower cost than conventional power amplifiers, while enabling high power without using expensive transistors in the voltage amplifier stage 2.

While the DC power source 5 supplies the DC power-supply voltages ±Vcc2 to both of the power amplifier stage 3 and the constant voltage circuit 8 in this preferred embodiment, the power amplifier may be constructed so that a separate DC power source other than the DC power source 5 supplies the DC power-supply voltages ±Vcc2 to the constant voltage circuit 8. Although specific values are used in this embodiment and individual circuit parts in the power amplifier are specifically shown in this embodiment and drawings, they are just examples and are not intended to limit the technical scope of the present invention.

While the invention has been described in detail, the foregoing description is in all aspects illustrative and not restrictive. It is understood that numerous other modifications and variations can be devised without departing from the scope of the invention.

What is claimed is:

1. A power amplifier for amplifying an input signal, comprising:
    a voltage amplifier stage to amplify voltage of the input signal and to output a high voltage output signal, wherein said voltage amplifier is capable of amplifying up to a first voltage level;
    a power amplifier stage to amplify power of the high voltage output signal and to output a high power output signal;
    a feedback circuit to attenuate the high power output signal and to output a feedback voltage signal to said voltage amplifier stage;
    a voltage divider having at least one resistance to divide the high power output signal and to output a divided voltage signal which is linear to the high power output signal; and
    a constant voltage circuit to regulate a supplied DC voltage to a constant voltage of up to a second voltage level which is lower than the first voltage level, the constant voltage being based on a voltage of an internal reference point, with the voltage of said internal reference point being varied by the divided voltage signal, and to supply the constant voltage to said voltage amplifier stage.

2. A power amplifier for amplifying an input signal recited in claim 1, further comprising a DC power source to supply the supplied DC voltage to said constant voltage circuit and to supply the supplied DC voltage to said power amplifier stage.

3. A power amplifier for amplifying an input signal recited in claim 1, wherein said voltage divider outputs the divided voltage signal which has a phase which is the same as a phase of the high power output signal, and wherein said voltage divider outputs the voltage signal which has an amplitude with a fixed ratio with respect to an amplitude of the high power output signal.

4. A power amplifier for amplifying an input signal recited in claim 1, wherein said constant voltage circuit adds the divided voltage signal to the supplied DC voltage, with the voltage of said internal reference point being varied by the divided voltage signal, to regulate the divided voltage signal to the constant voltage.

5. A power amplifier for amplifying an input signal recited in claim 1, wherein said voltage amplifier stage amplifies the voltage of the input signal on the basis of the feedback voltage signal from said feedback circuit to output the high voltage output signal.

6. A power amplifier for amplifying an input signal recited in claim 1, wherein said constant voltage circuit comprises:

first and second Zener diodes, each having an anode and a cathode, wherein said first and second Zener diodes are connected in series such that the anode of the first Zener diode is connected to the cathode of said second Zener diode and wherein said internal reference point is located between said first and second Zener diodes;

first and second transistors, each having a collector, a base and an emitter, wherein the base of said first transistor is connected to the cathode of said first Zener diode and the base of said second Zener diode is connected to the anode of said second Zener diode; and first and second resistances, wherein said first resistance is connected between the base and the collector of said first transistor and said second resistance is connected between the base and collector of said second transistor.

* * * * *